(12) United States Patent
Chen et al.

(10) Patent No.: US 7,250,728 B2
(45) Date of Patent: Jul. 31, 2007

(54) BOTTOM AND TOP EMISSION OLED PIXEL STRUCTURE

(75) Inventors: Wen-Kuen Chen, Jhubei (TW); Chung-Wen Ko, Sijhih (TW); Shi-Hao Lee, Banciao (TW)

(73) Assignee: AU Optronics, Hsinchu (TW)

( * ) Notice: Subject to any disclaimer, the term of this patent is extended or adjusted under 35 U.S.C. 154(b) by 0 days.

(21) Appl. No.: 10/829,317

(22) Filed: Apr. 21, 2004

(65) Prior Publication Data
US 2005/0237279 A1 Oct. 27, 2005

(51) Int. Cl.
*G09G 3/10* (2006.01)
*G09G 3/32* (2006.01)

(52) U.S. Cl. ............... 315/169.1; 345/60; 345/82; 345/90; 315/169.3

(58) Field of Classification Search ............ 315/169.1, 315/169.2, 169.3; 345/36, 45, 60, 68, 82, 345/90
See application file for complete search history.

(56) References Cited

U.S. PATENT DOCUMENTS

| | | | | |
|---|---|---|---|---|
| 6,043,478 A | * | 3/2000 | Wang | 250/208.1 |
| 6,791,260 B2 | * | 9/2004 | Komatsu et al. | 313/504 |
| 6,822,611 B1 | * | 11/2004 | Kontogeorgakis et al. | 343/702 |
| 7,030,552 B2 | | 4/2006 | Chao et al. | 313/504 |
| 2002/0036297 A1 | * | 3/2002 | Pichler | 257/103 |

FOREIGN PATENT DOCUMENTS

| | | | |
|---|---|---|---|
| JP | 2000-058260 | * | 2/2000 |
| TW | 586096 B | | 5/2004 |

* cited by examiner

*Primary Examiner*—Trinh Vo Dinh
(74) *Attorney, Agent, or Firm*—Duane Morris, LLP

(57) ABSTRACT

A bottom and top emission OLED structure includes: first and second anodes; first and second organic light-emitting layers disposed between the first and second anodes. A first electrode may be disposed between the first and second organic light-emitting layers or first and second electrically isolated electrodes may be disposed between the first and second organic light-emitting layers.

4 Claims, 5 Drawing Sheets

BOTTOM AND TOP EMISSION OLED PIXEL STRUCTURE

FIELD OF INVENTION

The present invention relates to light-emitting diode pixel structures for flat panel displays, and more particularly, to a light-emitting diode pixel structure that is capable of top and bottom emission, and a display structure that utilizes such a pixel structure.

BACKGROUND OF THE INVENTION

There are many types of flat panel displays that have been and are currently being developed. One popular type of flat panel display is a liquid crystal display (LCD). LCDs generally perform well, but have somewhat narrow viewing angles, relatively slow signal response times, and require background lighting. Consequently, LCDs are not at their best for high-speed image animation and consume additional energy powering the background lighting. In addition, large LCDs are difficult to produce.

Organic light emitting diode (OLED) displays have been developed to address the disadvantages of LCDs. Unlike LCDs, which modulate light generated by their background lighting systems, OLED displays emit light via an array of OLED-based pixels.

FIGS. 1A and 1B respectively illustrate conventional bottom and top emission OLED pixel structures 120, 120'. The bottom emission OLED pixel structure 120 shown in FIG. 1A, is constructed on a transparent substrate 100 and includes: a bottom, transparent anode 130 disposed on the substrate 100; an organic light-emitting layer 140 containing an organic light-emitting material disposed on the anode 130; and a top, metal electrode 150 disposed on the organic light-emitting layer 140. Light is emitted from the bottom of the OLED pixel structure 120 by the light-emitting layer when an electric current passes between the anode 130 and the metal electrode 150.

The top emission OLED pixel structure 120' shown in FIG. 1B, is constructed on a transparent substrate 100 and includes: a bottom, metal electrode 150' disposed on the substrate 100; an organic light-emitting layer 140 containing an organic light-emitting material disposed on the metal electrode 150'; and a top, transparent cathode 135 disposed on the organic light-emitting layer 140. Light is emitted from the top of the OLED pixel structure 120' by the light-emitting layer 140 when an electric current passes between the metal electrode 150' and the cathode 135.

Although conventional bottom and top emission OLED pixel structures are satisfactory for OLED display applications that only require images to be displayed on one side of the display, there are potential OLED display applications that require images to be displayed on both sides of the display. Such a two-sided OLED display would require an OLED pixel structure that emits light from the top and the bottom.

Accordingly, a need exists for an OLED pixel structure that is capable of emitting light from the top and bottom thereof.

SUMMARY OF INVENTION

A bottom and top emission OLED structure is disclosed herein. The OLED pixel structure comprises: first and second anodes; first and second organic light-emitting layers disposed between the first and second anodes. In a first embodiment, a first electrode is disposed between the first and second organic light-emitting layers. In a second embodiment, a first and second electrically isolated electrodes are disposed between the first and second organic light-emitting layers.

BRIEF DESCRIPTION OF THE DRAWINGS

FIG. 4A shows the device in a flip-up position and FIG. 4B shows the device in a flip-down position.

DETAILED DESCRIPTION OF THE INVENTION

Figure 1A:
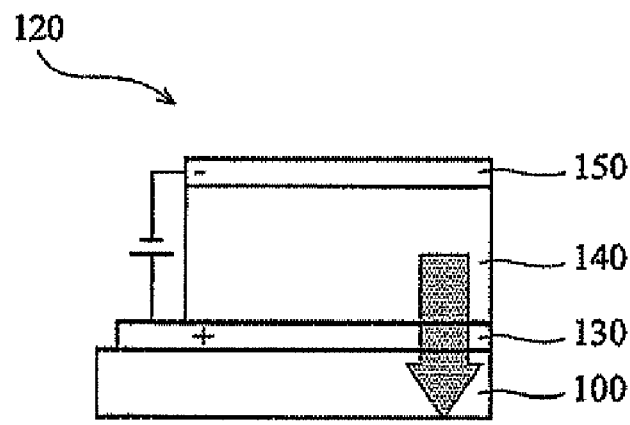
FIG. 1A shows a cross-sectional view of a conventional bottom emission OLED pixel structure.
Figure 1B:
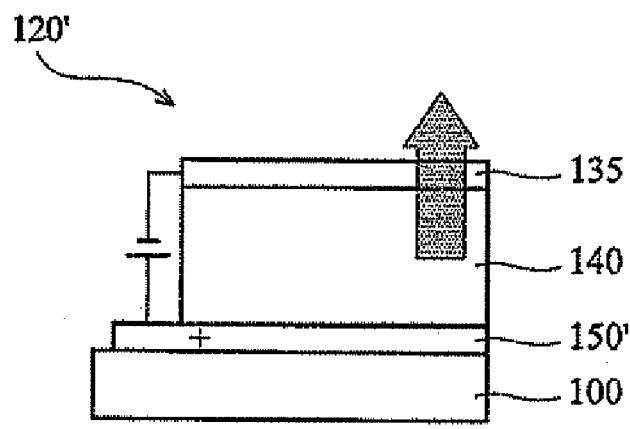
FIG. 1B shows a cross-sectional view of a conventional top emission OLED pixel structure.
Figure 2A:
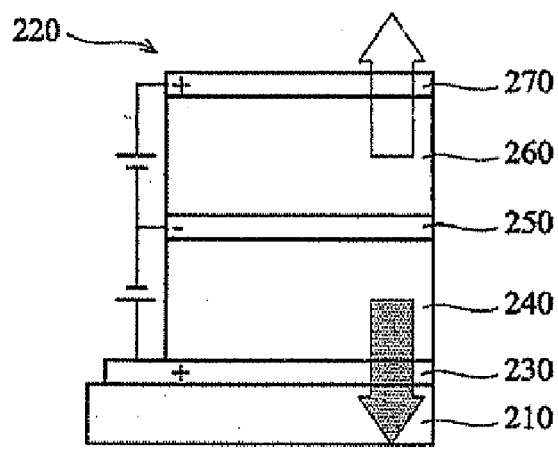
FIG. 2A shows a cross-sectional view of a bottom and top emission OLED pixel structure according to a first embodiment of the invention.

FIG. 2A is a cross-sectional view of a bottom and top emission OLED pixel structure 220 according to a first embodiment of the invention. As shown in FIG. 2A, the OLED pixel structure 220 is constructed over a transparent substrate 210 which may be a glass panel, a plastic panel or a flexible panel, for example. As further shown in FIG. 2A, the OLED pixel structure 220 includes a transparent, bottom anode 230, a bottom organic light-emitting layer 240, a common metal electrode 250, a top organic light-emitting layer 260, and a transparent, top anode 270. The bottom anode 230, bottom organic light-emitting layer 240, common metal electrode 250, top organic light-emitting layer 260, and top anode 270 are sequentially formed over the transparent substrate 210.

The bottom and top anodes 230, 270 inject electron holes into their respective bottom and top light-emitting layers 240, 260 in an efficient manner. Thus, each of the anodes 230, 270 preferably have a work function greater than 4.5eV. The transparent top and bottom anodes 230, 270 may be formed from the same material or from different materials. Such materials include, without limitation, indium-tin-oxide (ITO), tin oxide, gold, silver, platinum or copper.

Figure 5:
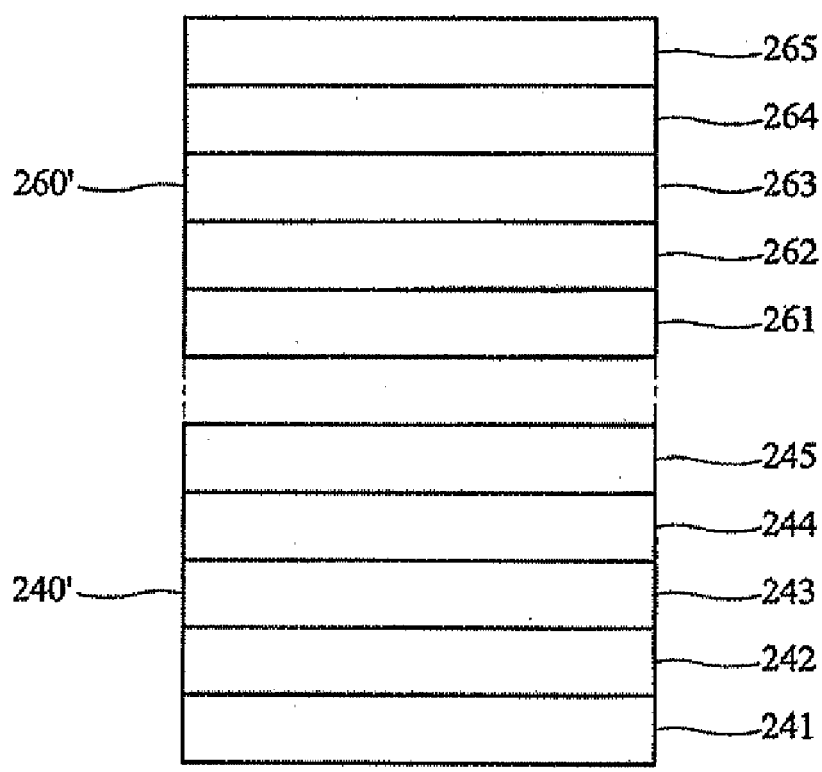
FIG. 5 shows a cross-sectional view of a bottom and top emission OLED pixel structure according to a third embodiment of the invention.

The bottom and top organic light-emitting layers 240, 260 may be the single layer structure shown in FIG. 2A, a multilayered structure as shown in FIG. 5, or a combination thereof. FIG. 5 shows an exemplary embodiment wherein the bottom and top organic light-emitting layers 240', 260' are formed by multilayered structures. The bottom organic light-emitting layer 240' is formed by a hole injection layer 241, a hole transporting layer 242, an emission layer 243, an electron transporting layer 244, and an electron injection layer 245. The top organic light-emitting layer 260' is formed by an electron injection layer 261, an electron transporting layer 262, an emission layer 263, a hole transporting layer 264, and a hole injection layer 265.

The materials used for these single or multilayered light-emitting structures 240, 260 include, without limitation, light-emitting polymeric materials or light-emitting small organic molecules formed, for example, by spin coating. The top and bottom organic light-emitting layers 240, 260 each produce light of a desired color according to the energy gap between the base state and the activated state of the material used for that layer.

The common metal electrode 250 is disposed between the bottom and top light-emitting layers 240, 260 for injecting electrons into the light-emitting layers 240, 260 in an efficient manner. The common metal electrode 250 can be a single conductive layer having a high work function such as an aluminum layer or a silver layer. Alternatively, the common electrode 250 can be a double conductive layer such as a lithium fluoride/aluminum layer, a barium/aluminum layer or a magnesium/silver layer. The common metal electrode 250 may be formed, for example, by vacuum evaporation.

In operation, light is emitted from the bottom or top (or both bottom and top) of the OLED pixel structure 220 by the structure's respective bottom and top light-emitting layers 240, 260 when an electric current is passed between the bottom anode 230 and common metal electrode 250 and/or top anode 270 and the common metal electrode 250.

Figure 2B:
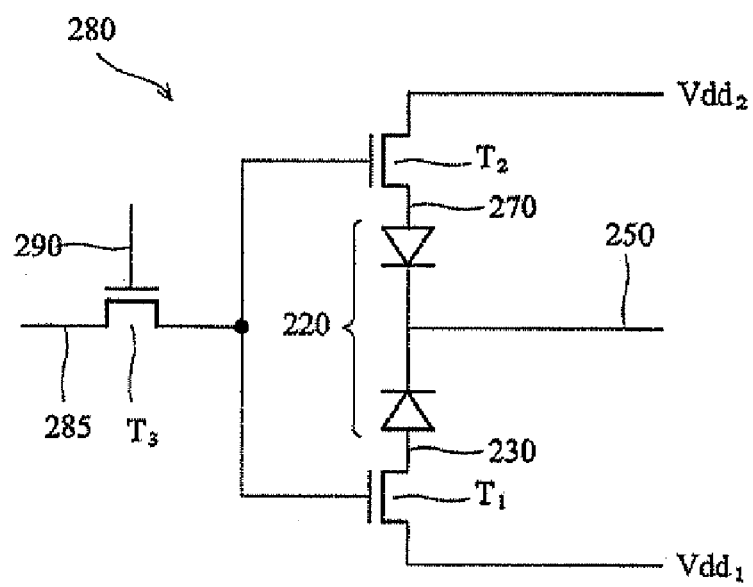
FIG. 2B shows a schematic diagram of the bottom and top emission OLED pixel structure of FIG. 2A in an active matrix display.

FIG. 2B is a schematic diagram showing the bottom and top emission OLED pixel structure 220 of FIG. 2A in an active matrix display 280. Although only one OLED pixel structure 220 is shown in FIG. 2B, it should be understood that such a display would contain an array of OLED pixel structures 220. As shown in FIG. 2B, the bottom anode 230 of the OLED pixel structure 220 is electrically coupled to a source electrode of a first driving transistor T1 and the top anode 270 of the OLED pixel structure 220 is electrically coupled to a source electrode of a second driving transistor T2. The common metal electrode 250 is electrically coupled to common voltage (Vcom). Drain electrodes of the first and second transistors T1 and T2 are electrically coupled to Vdd1 and Vdd2 bus lines respectively and gate electrodes of the first and second transistors T1 and T2 are electrically coupled to a drain electrode of a switching transistor T3. A source electrode of the switching transistor T3 is electrically coupled to a data line 285 and a gate electrode of the switching transistor T3 is electrically coupled to a scan line 290. The transistors T1, T2, and T3 forming the active matrix control components may be PMOS or NMOS. In the shown embodiment of FIG. 2B, the transistors T1, T2, and T3 are NMOS.

Figure 3A:
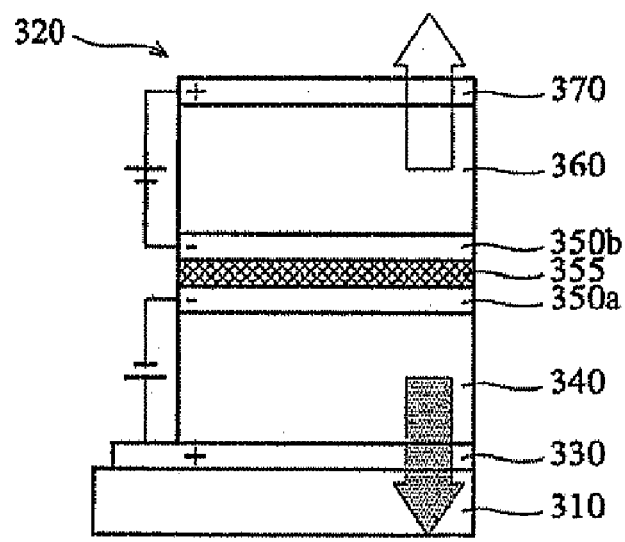
FIG. 3A shows a cross-sectional view of a bottom and top emission OLED pixel structure according to a second embodiment of the invention.

FIG. 3A is a cross-sectional view of a bottom and top emission OLED pixel structure 320 according to a second embodiment of the invention. As in the first embodiment, the OLED pixel structure 320 is constructed over a transparent substrate 310 which may be a glass panel, a plastic panel or a flexible panel, for example. The OLED pixel structure 320 of the second embodiment includes a transparent, bottom anode 330, a bottom organic light-emitting layer 340, a bottom metal electrode 350a, an insulation layer 355, a top metal electrode 350b, a top organic light-emitting layer 360, and a transparent, top anode 370. The bottom anode 330, bottom organic light-emitting layer 340, bottom metal electrode 350a, insulation layer 355, top metal electrode 350b, top organic light-emitting layer 360, and top anode 370 are sequentially formed over the transparent substrate 310.

The bottom and top anodes 330 and 370 of the second embodiment are similar to the bottom and top anodes of the first embodiment in construction and operation. The bottom and top organic light-emitting layers 340, 360 of the second embodiment may also be similar to the bottom and top organic light-emitting layers of the embodiments shown in FIGS. 2A or FIG. 5, in construction and operation.

The bottom and top metal electrodes 350a, 350b inject electrons into their respective bottom and top light-emitting layers 340, 360 in an efficient manner. The bottom and top metal electrodes 350a, 350b may each be formed as a single conductive layer having a high work function such as an aluminum layer or a silver layer or as a double conductive layer such as a lithium fluoride/aluminum layer, a barium/aluminum layer or a magnesium/silver layer. The bottom and top metal electrodes 350a, 350b may be formed, for example, by vacuum evaporation.

The insulation layer 355 is disposed between the bottom and top metal electrodes for electrically isolating the electrodes from one another. The insulation layer may be formed from one or more films of dielectric material such as SiOx or SiNx by a sputtering or CVD process.

In operation, light is emitted from the bottom or top (or both bottom and top) of the OLED pixel structure 320 by the structure's respective bottom and top light-emitting layers 340, 360 when an electric current is passed between the bottom anode 330 and the metal electrode 350a and/or top anode 370 and the metal electrode 350b.

Figure 3B:
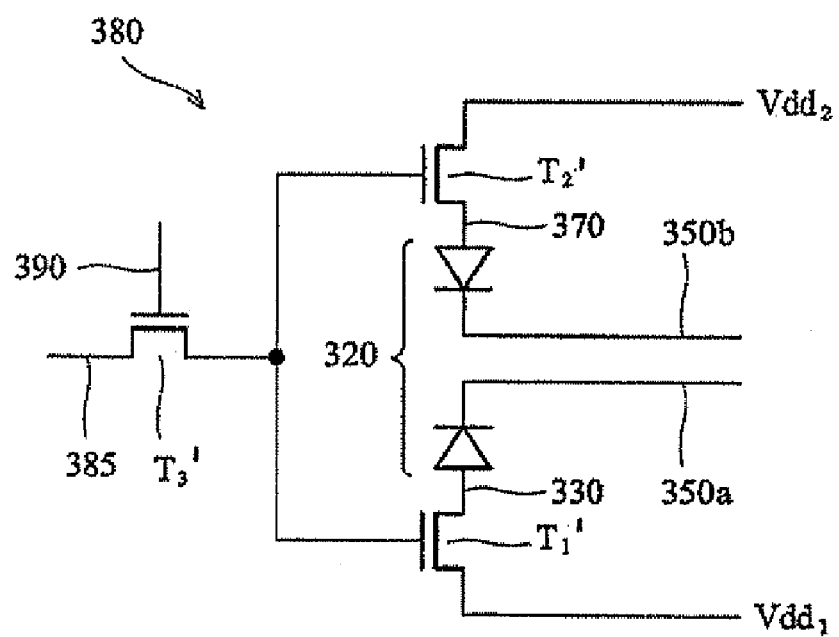
FIG. 3B shows a schematic diagram of the bottom and top emission OLED pixel structure of FIG. 3A in an active matrix display.

FIG. 3B is a schematic diagram showing the bottom and top emission OLED pixel structure 320 of FIG. 3A in an active matrix display 380. Although only one OLED pixel structure 320 is shown in FIG. 3B, it should be understood that such a display would contain an array of OLED pixel structures 320. As shown in FIG. 3B, the bottom anode 330 of the OLED pixel structure 320 is electrically coupled to a source electrode of a first driving transistor T1' and the top anode 370 of the OLED pixel structure 320 is electrically coupled to a source electrode of a second driving transistor T2'. The bottom and top metal electrodes 350a, 350b are each electrically coupled to Vcom. Drain electrodes of the first and second transistors T1' and T2' are electrically coupled to Vdd1 and Vdd2 bus lines respectively and gate electrodes of the first and second transistors T1' and T2' are electrically coupled to a drain electrode of a switching transistor T3'. A source electrode of the switching transistor T3 is electrically coupled to a data line 385 and a gate electrode of the switching transistor T3 is electrically coupled to a scan line 390. The transistors T1', T2', and T3' forming the active matrix control components may be PMOS or NMOS. In the shown embodiment of FIG. 3B, the transistors T1', T2', and T3' are NMOS.

Figure 4A:
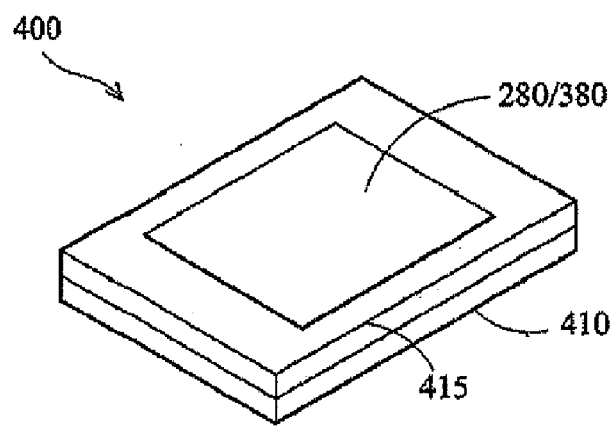
FIGS. 4A and 4B show are perspective views of a telecommunication device that utilizes the active matrix display of FIGS. 2B or 3B.
Figure 4B:
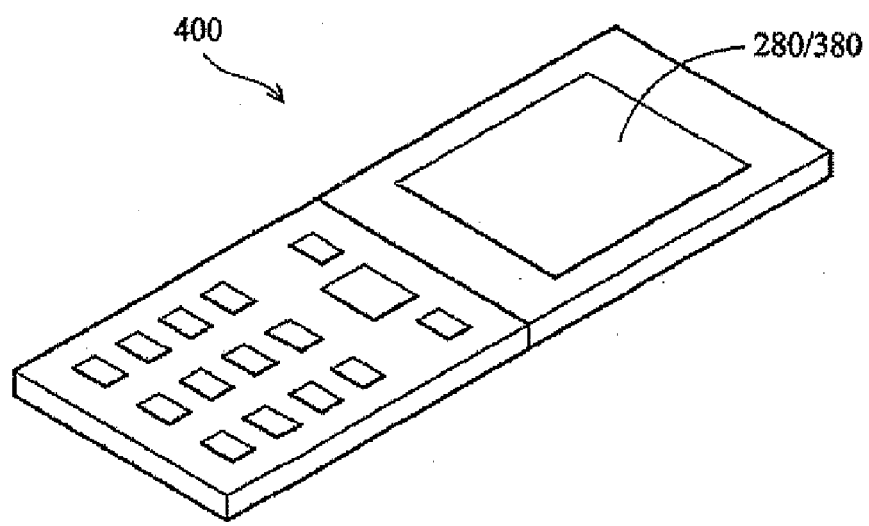

FIGS. 4A and 4B show a telecommunication device 400, such as a cellular telephone, that utilizes the active matrix display 280, 380 of FIGS. 2B or 3B. The device 400 includes a main body 410 having a flip-up door 415 that contains the active matrix display panel of FIGS. 2B or 3B. The bottom and top emission OLED pixel structures making up the active matrix display allow the display 280, 380 to be viewed by a user from either side of the display. Accordingly, the display 280, 380 may be viewed by the user when the door 415 is in either the flip-up (FIG. 4A) or flip-down position (FIG. 4B).

The displays 280, 380 of FIGS. 2B and 3B may also be used in other applications where viewing from both sides is desired.

While the foregoing invention has been described with reference to the above, various modifications and changes can be made without departing from the spirit of the invention. Accordingly, all such modifications and changes are considered to be within the scope of the appended claims.

What is claimed is:

1. A display comprising:

organic light-emitting diode structures forming an array, each of the organic light-emitting diode structures comprising:

first and second anodes;

first and second organic light-emitting layers disposed between the first and the second anodes;

a common electrode disposed between the first and the second organic light-emitting layers;

a first transistor coupled to each of the organic light-emitting diode structures, the first transistor coupled to one of the first and the second anodes of the organic light-emitting diode structures;

a second transistor coupled to each of the organic light-emitting diode structures, the second transistor coupled to the other one of the first and the second anodes of the organic light-emitting diode structures; and a third transistor coupled to the first and the second transistors, the third transistor for switching the first and second transistors, wherein the first organic light-emitting layer is for substantially emitting light in a first direction and the second organic light-emitting layer is for substantially emitting light in a second direction opposite to the first direction.

2. The display according to claim 1, wherein the first and the second transistors drive the organic light-emitting diode structures.

3. The display according to claim 1, wherein light is emitted from at least one of the first and the second organic light-emitting layers when an electric current passes between one of the first and the second anodes and the first electrode.

4. A telecommunication device comprising:

a main body;

a flip-up door connected to the main body;

a display beneath the flip-up door, the display comprising:

organic light-emitting diode structures forming an array, each of the organic light-emitting diode structures comprising:

first and second anodes;

first and second organic light-emitting layers disposed between the first and the second anodes; and a common electrode disposed between the first and second organic light-emitting layers;

a first transistor coupled to each of the organic light-emitting diode structures, the first transistor coupled to one of the first and the second anodes of the organic light-emitting diode structures;

a second transistor coupled to each of the organic light-emitting diode structures. the second transistor coupled to the other one of the first and the second anodes of the organic light-emitting diode structures; and a third transistor coupled to the first and the second transistors, the third transistor for switching the first and second transistors, wherein the first organic light-emitting layer is for substantially emitting light in a first direction and the second organic light-emitting layer is for substantially emitting light in a second direction opposite to the first direction.

* * * * *